United States Patent [19]
Ravi

[11] 4,152,536
[45] May 1, 1979

[54] SOLAR CELLS

[75] Inventor: K. V. Ravi, Sudbury, Mass.

[73] Assignee: Mobil Tyco Solar Energy Corp., Waltham, Mass.

[21] Appl. No.: 856,636

[22] Filed: Dec. 2, 1977

Related U.S. Application Data

[62] Division of Ser. No. 638,186, Dec. 5, 1975, Pat. No. 4,095,329.

[51] Int. Cl.² .................................................. H01L 31/06
[52] U.S. Cl. .................................. 136/89 SJ; 357/30; 136/89 CC
[58] Field of Search .......... 136/89 CC, 89 SJ, 89 TF, 136/89 PC; 357/20, 30, 55

[56] References Cited

U.S. PATENT DOCUMENTS

| | | | |
|---|---|---|---|
| 3,976,508 | 8/1976 | Mlavsky | 136/89 |
| 3,990,914 | 11/1976 | Weinstein et al. | 136/89 |

*Primary Examiner*—Aaron Weisstuch
*Attorney, Agent, or Firm*—Schiller & Pandiscio

[57] ABSTRACT

Disclosed are solar cells employing slightly curved or nearly flat monocrystalline silicon ribbons. The ribbons are formed by cutting or slicing monocrystalline hollow tubes along their lengths, the tubes having been formed according to crystal growing processes disclosed in U.S. Pat. No. 3,591,348.

3 Claims, 7 Drawing Figures

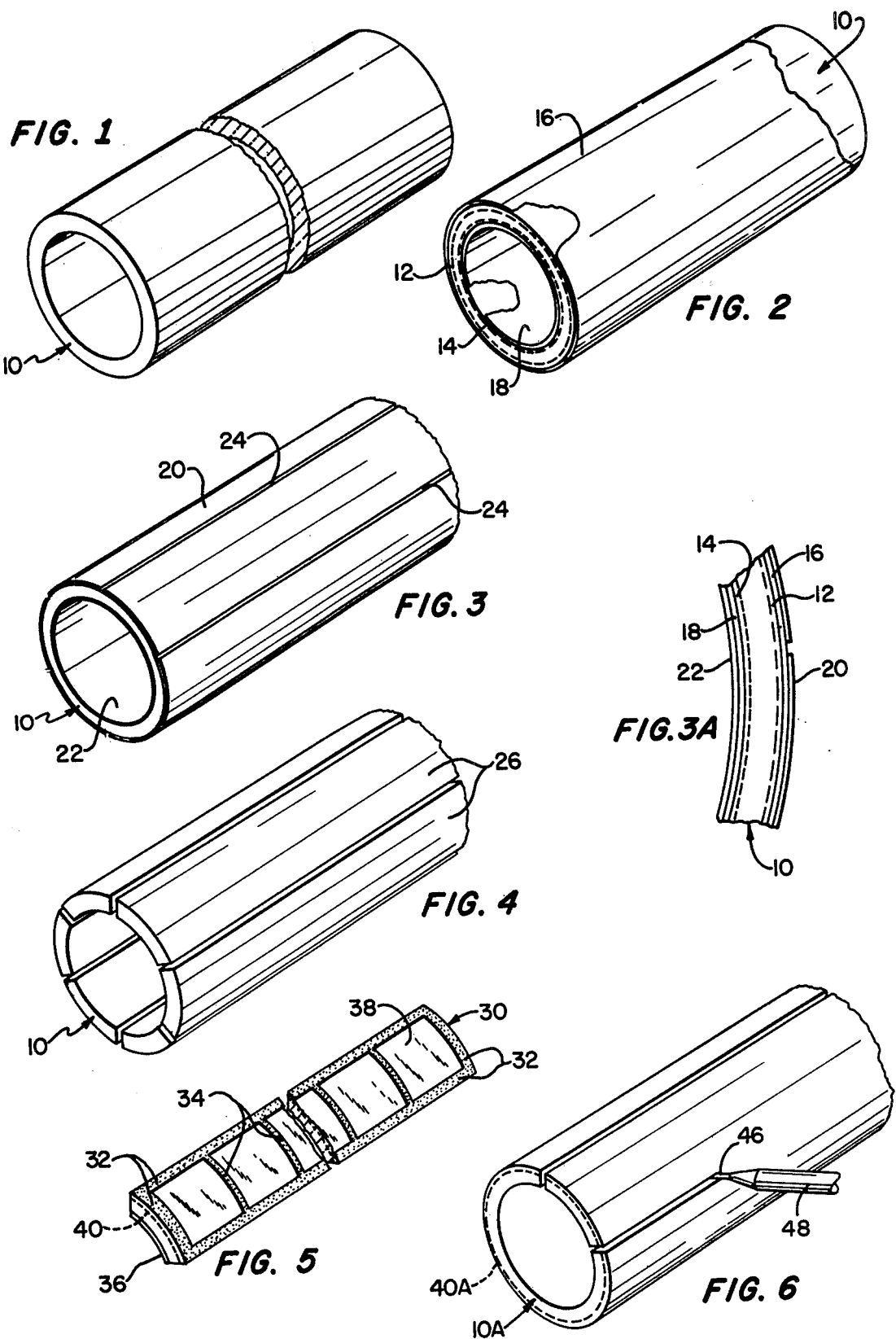

SOLAR CELLS

This application is a division of my copending application Ser. No. 638,186 filed Dec. 5, 1975 for Manufacture of Semiconductor Ribbon and Solar Cells, now U.S. Pat. No. 4,095,329.

The present invention relates to the art of converting solar energy into electrical energy and more particularly to improved processes for forming substantially monocrystalline silicon for use in solar cells, and for forming solar cells, and to the resulting solar cells.

It is well known that radiation of an appropriate wavelength falling on a P-N junction of a semiconductor body seerves as a source of external energy to generate hole-electron pairs in that body. Because of the potential difference which exists at a P-N junction, holes and electrons move across the junction in opposite directions and thereby give rise to flow of an electric current that is capable of delivering power to an external circuit. Most solar cells are made of silicon but cells made of other materials, e.g. cadmium sulfide and gallium arsenide, have also been developed and tested. Silicon is a favored material since it has a band gap of approximately 1.1 electron volts and thus responds quite favorably to electromagnetic energy having a wave-length in the visible and ultraviolet regions of the spectrum.

At the state of the art prior to this invention, solar cells are most commonly fabricated using semiconductor-grade silicon monocrystals (or other suitable semiconductor materials as known in the art) in substantially flat ribbon form. The silicon ribbons may be provided initially by growing the latter from a melt according to the process disclosed in U.S. Pat. No. 3,591,348 issued to Harold E. LaBelle, Jr. Using the process disclosed by LaBelle, monocrystalline silicon bodies may be grown having controlled and predetermined cross-sectional shapes, e.g. round rods and tubes and flat ribbons, by means of so-called capillary die members which employ capillary action for replenishing the melt consumed by crystal growth. In the process described in U.S. Pat. No. 3,591,348 the crystal is pulled from a thin film of melt which is supported on the upper end surface of a die member that has one or more capillaries for feeding melt to its upper end surface from a reservoir pool so as to automatically replenish the film. The film fully covers the end surface of the die member and, since crystal growth occurs from the full expanse of the film, the growing crystal has a cross-sectional shape substantially corresponding to the end configuration of the upper end surface of the die member. The process disclosed in U.S. Pat. No. 3,591,348 is frequently described as the "EFG" process where the term "EFG" is an abbreviation for "Edge-defined, film-fed growth".

Silicon ribbons employed in solar cells must be substantially monocrystalline, uniform in size and shape and substantially free of crystal defects. It is not difficult to control the size and shape of substantially monocrystalline ribbons grown by the EFG process. However, one problem which results during the production of flat elongate monocrystals grown from the melt is the formation of defects adjacent the ribbon edges. Although not known for certain, it is believed that such edge defects result from the shape of the liquid/solid interface at the ribbon edges or the accumulation adjacent the crystal edges of impurities present in the melt. These edge defects are objectionable and the ribbons must be processed further to remove the defects before they can be used.

Accordingly, the primary object of this invention is to provide a relatively simple and inexpensive method for producing semiconductor grade silicon ribbon (or other suitable semiconductor material) for use in fabricating solar cells or other semiconductor devices.

Another object is to provide relatively inexpensive, high quality silicon of the character described.

Still other objects are to provide a new and improved method for producing high quality solar cells.

The foregoing and other objects are achieved by a manufacturing method which basically comprises first producing a substantially monocrystalline tubular body of silicon or other suitable semiconductor material and then cutting the tubular body along its length to produce a plurality of nearly flat, monocrystalline ribbons. Preferably the cutting of the tubular body is achieved by etching, as with an acid jet. In a preferred mode of practicing the invention to produce solar cells, the tubular body is treated to form an annular rectifying junction, then it is severed longitudinally to form a plurality of nearly flat ribbons, and finally the ribbons are modified to form solar cells.

Other features and many of the attendant advantages of this invention are set forth in or rendered obvious by the following detailed description which is to be considered together with the accompanying drawings wherein:

FIG. 1 is a perspective view with a portion broken away of a tubular monocrystalline silicon body at a first stage of the manufacture of a solar cell in accordance with the present invention;

FIG. 2 is a perspective view with a portion broken away of the monocrystalline body of FIG. 1 at a second stage of solar cell manufacture;

FIG. 3 is a perspective view with a portion broken away of the monocrystalline body of FIG. 1 at a third stage of solar cell manufacture;

FIG. 3A is an enlarged end view of a portion of the body shown in FIG. 3;

FIG. 4 is a perspective view with a portion broken away of the monocrystalline body of FIG. 1 at a fourth stage of solar cell manufacture;

FIG. 5 is a perspective view with a portion broken away of a preferred form of solar cell constructed in accordance with this invention; and FIG. 6 is a perspective view of a portion of a tubular monocrystalline body showing an alternative method of forming individual nearly flat ribbons.

In the drawings, like numerals refer to like parts.

As is well known to persons skilled in the art, substantially monocrystalline silicon bodies of selected cross-sectional shape can be readily produced by the process described and claimed in U.S. Pat. No. 3,591,348 issued to Harold E. LaBelle, Jr., using die members made of graphite and graphite dies coated with silicon carbide (see T. F. Ciszek, Edge-defined, Film-Fed Growth of Silicon Ribbons, Mat. Res. Bull, Vol. 7, pps. 731–738, 1972). Substantially monocrystalline silicon bodies of tubular shapes may be grown by means of dies shaped like the dies shown in said U.S. Pat. No. 3,591,348 and also U.S. Pat. No. 3,687,633, issued Aug. 29, 1972 to Harold E. LaBelle, Jr., et al. By controlling the growth environment and using a semiconductor grade melt, it is possible to grow tubular, substantially monocrystalline bodies of silicon with a purity suitable for semiconductor purposes. Also by introducing suitable conductivitytype-determining impurities, i.e. dopants, to the melt it is possible to produce tubular bodies by the aforesaid processes which have a P- or N-type conductivity and a predetermined resistivity. The addition of a dopant to a melt from which a crystal is grown in conventional, for example, with Czochralski-type processes and also is exemplified by U.S. Pat. Nos. 3,129,061 and 3,394,994.

Since a tubular body is continuous in cross-section, it has no edge regions comparable to the long side edges of a ribbon. Accordingly, tubular bodies do not have the edge surface defects as normally found in flat ribbons or other shapes having two or more defined side edges. More precisely, a tubular body grown by the EFG process has better crystallinity than ribbons grown by same EFG process under the same conditions. In addition, the absence of edges leads to better stability during growth, permitting greater growth flexibility and hence quality of the crystals. Furthermore tubes of silicon can be grown at quite high growth rates.

Accordingly the essence of this invention is to produce ribbon-like bodies for use in making semiconductor devices by first growing a substantially monocrystalline tubular body and then slicing the tube lengthwise into a plurality of ribbon-like pieces which may be used to form the devices.

While the invention may be used to provide ribbon-like bodies of a variety of materials, the following description illustrates the production of solar cells using silicon as the semi-conductor material.

In the preferred mode of practicing this invention, a tubular body of one type conductivity is provided initially, and such body is then treated to provide a zone of opposite type conductivity with a rectifying junction created between such zones. The zone of opposite type conductivity may be formed in various ways known to persons skilled in the art, e.g. by diffusion or ion implantation of dopants or by epitaxial deposition of opposite type conductivity material. Preferably, the zone is formed by diffusing a suitable dopant into the body. Thus, if the hollow body is a P-type semiconductor, a suitable N-type dopant is diffused into it to create an N-type conductivity zone. Similarly, if the hollow body is an N-type semiconductor, a suitable P-type dopant is diffused into it to create a P-type conductivity zone. The choice of dopant used depends on the material of which the hollow body is composed and also its conductivity type. Thus, for example, boron may be diffused into N-type silicon to produce a zone of P-type conductivity while phosphorus may be diffused into P-type silicon to produce a zone of N-type conductivity. The several types of dopants used for modifying the conductivity of silicon and how such conductivity-modifying impurities may be diffused into a silicon body are well known (see, for example, U.S. Pat. Nos. 3,162,507; 3,811,954; 3,089,070; 3,015,590; and 3,546,542). The types of dopants required to modify the conductivity type of other materials, e.g. gallium arsenide, cadmium telluride, etc., also are well known to persons skilled in the art. In accordance with prior art knowledge, the concentration of dopants in the P- and N-regions of the tubular structures is controlled to obtain the desired resistivity of the P- and N-type regions. For solar cells, the resistivity of such regions is held to less than about 100 ohm-cm and for best conversion efficiency is between about 0.001 to about 10 ohm-cm; also in order to improve the efficiency of collecting the photoelectrically produced carriers, the depth of the P-N junction from the surface which is to serve as the radiation receiving surface, is made small, preferably in the order of ½ micron.

After the P-N junction is formed, the hollow body is sliced or cut lengthwise to produce a plurality of slightly curved or nearly flat elongated silicon bodies. The nearly flat elongated bodies are then provided with ohmic contacts or electrodes for their P- and N-type zones, whereby the resulting solar cell units may be connected to an exterior circuit.

If desired, the solar cells may be coated with a suitable anti-reflection or interference film to reduce reflection losses of solar radiation or to block absorption of infrared radiation.

An example of the preferred mode of practicing the invention will now be described with reference to FIGS. 1-5. Turning first to FIG. 1, a tubular body 10 of a substantially monocrystalline P-type silicon is provided by growing it from a boron doped, semiconductor grade silicon melt under an inert atmosphere using the above-described EFG process. The tubular body is grown from a melt contained in a quartz crucible (not shown) using a die (not shown) consisting of two graphite cylinders disposed concentrically one inside the other and locked together in the manner of the two sleeves 24 and 26 of FIG. 1 of U.S. Pat. No. 3,687,633. The gap between the two graphite cylinders is sized to serve as a capillary for molten silicon and the die assembly is disposed so that melt can enter the bottom end of the capillary and rise to its upper end by capillary action. This tubular body 10 is then introduced into a diffusion furnace where it is exposed to a gaseous mixture of oxygen and phosphorous oxychloride at a temperature of about 1000° C. for a period of about 15 to 30 minutes. As a consequence of this diffusion step, phosphorous is diffused into the outer and inner surfaces of the tube so as to form an N-P-N structure (see FIGS. 2 and 3A) with relatively shallow outer and inner N regions 12 and 14 and thin layers 16 and 18 of silicon dioxide covering the outer and inner surfaces. The N regions 12 and 14 each have a depth of about 0.5 microns and the diffusion oxide layers each have a thickness of about 3000Å. The formation of the diffusion oxide layers results from the presence of oxygen which is used as the transport medium for the phosphorous oxychloride.

Thereafter as shown in FIG. 2, the outer and inner surfaces of the tube are coated with a conventional polymethylmethacrylate positive resist material as represented at 20 and 22 (for convenience of illustration the N regions 13 and 14 and the oxide layers 16 and 18 are not specifically shown in FIGS. 3 and 4). Then the outer photoresist layer 20 is exposed to a narrow light beam, so that a plurality of circumferentially spaced, straight and narrow longitudinally extending areas of the resist coating 20 are exposed to the beam and thereby altered to a lower molecular weight polymer. The tube is then immersed in a preferential solvent or etchant such as methyl isobutyl ketone, with the result that the unexposed portions of the resist coating 20 remain intact while the exposed areas are dissolved away as represented at 24 in FIG. 3 to expose narrow line portions of the outer oxide layer 16.

The next step involves etching the tube so as to subdivide it into a plurality of narrow strips 26 as shown in FIG. 4. This is achieved in two stages. In the first stage the tube is immersed in HF at room temperature for about 1-2 minutes so as to dissolve the exposed narrow portions of the outer oxide layer 16. In the second stage the tube is immersed in KOH at room temperature for about 10 minutes (this time being determined by the tube thickness (or in a mixture of one part HF and three parts HNO₃), whereby the silicon tube is etched into precise width ribbon-like sections 26. Depending upon the tensile strength of the inner resist layer 22 and its adherence to the tube, the sections 26 may or may not detach themselves from that layer when the etchant has dissolved through the full wall thickness of the tube. In any event, etch cut sections 26 are removed from the etchant bath and trichloroethylene is applied so as to dissolve away the inner resist layer from each section. Then the ribbon-like sections 26 are immersed in HF followed by KOH (or a mixture of HNO₃ & HF) at room temperature for a period of about 2-3 minutes. This etch step serves to remove their inner oxide layers and their inner N conductivity regions 14.

Thereafter trichloroethylene is applied to each ribbon-like section 26 to dissolve away its outer resist layer 20 and then the sections 26 are again immersed in HF at room temperature long enough (about 2-3minutes) to remove the outer oxide layer 16 but not the outer N-conductivity region 12.

The final step is to apply electrodes to the outer and inner surfaces of the sections 26 (FIG. 5). The electrodes are formed by a conventional metalization technique. Preferably the electrodes are nickel and are applied by electroless plating. Alternatively the electrodes may be laminates formed by evaporation deposition and comprise a layer of aluminum attached to the silicon body and a layer of silver bonded to the aluminum layer. Other electrode materials also may be used and the electrodes may be formed by other techniques known to persons skilled in the art. As shown in FIG. 5, the electrode 30 on the outer surface of the ribbon-like body 26 is formed as a grid with relatively wide side and end sections 32 and relatively narrow transverse sections 34 spaced so that a major portion of the outer surface 38 of the silicon body is uncovered and thus exposed to receive solar radiation. The other electrode 36 preferably covers the entire expanse of the inner surface of the silicon body. The resulting structure is a solar cell characterized by a substantially planar P-N junction represented by the dotted line 40 that lies close to the outer, i.e. upper surface of the cell and electrodes 30 and 36 for coupling the cell into an electrical circuit.

The presence of the silicon dioxide layers 16 and 18 is advantageous in that the layers help to protect the silicon tube 10 in the event of any breakdown of the photoresist layers 20 and 22 to the etchant. On the other hand, the silicon dioxide layers are not required if the photoresist is applied with sufficient care to protect the inner and outer surfaces of the tubular body from being attacked by the etchant except along the areas 24 as above described. The formation of the oxide layers can be avoided by using nitrogen instead of oxygen as the transport medium for the phosphorous dopant. The formation of the oxide layers also can be avoided by diffusing phosphorous into the tubular body by means of phosphene gas which can be introduced into a diffusion furnace without having to be admixed with any transport medium.

The formation of silicon dioxide on the layers at the inner and outer surfaces of the body also can be achieved when the P-N junction is formed by ion-implantation rather than by diffusion. The ion-implantation is carried out in a vacuum so that no oxides are formed. After the ion-implantation has been completed, the tube is annealed in an oxygen furnace at a temperature of about 1000° C. for a period of about 15 minutes whereby silicon dioxide layers are formed at the inner and outer surfaces of the body. The annealing process is conducted so as to maintain the diffusion oxide layers to a thickness of about 2 to 5 microns. The ion-implantation approach offers the advantage that the dopant is introduced only at the outer surface of the tubular body, thereby omitting the need for removing an inner opposite conductivity region corresponding to the N-type region 14. With the ion-implantation approach, the tube 10 is converted so that, beginning at its inner side and terminating at its outer side, it comprises an inner oxide layer, a P-type layer, a junction, an N-type layer, and an outer oxide layer. The etch cutting of a tube which has been subjected to ion-implantation is essentially the same as the etch cutting technique required for tubes which have been subjected to diffusion doping. Specifically, the resist material is applied as coatings 20 and 22 to the inner and outer surfaces of the tube, the areas 24 are formed by exposing and dissolving the resist as previously described, and the elongate nearly flat segments 26 are formed by submerging the tubular body in a suitable etchant. The inner and outer electrodes are formed on the sections 26 after the resist coatings and the inner and outer diffusion oxides have been removed as previously described.

It is to be understood of course, that even if the tube is subjected to ion-implantation, the formation of silicon dioxide layers at the inner and outer surfaces of the tubular body may be avoided by annealing the tube in a nitrogen rather than an oxygen atmosphere.

It is understood of course that the tubular bodies could be sliced lengthwise into ribbon-like sections as shown at 26 by subjecting the tubular body to the action of a mechanical cutting means rather than an etchant.

A further alternative method for cutting the tubular body into nearly flat ribbons is illustrated in FIG. 6. In this case, a tubular body 10A of one type conductivity material, e.g. N or P-type silicon, is processed so as to form a P-N junction 40A near its outer surface. The tubular body is then cut by impinging onto its outer surface a fine jet 46 of a selected etch solution, e.g. HF and HNO₃ or KOH in the case of silicon. The jet of etchant is directed onto the tubular body via a nozzle 48 which is connected to a supply of etchant. The nozzle and the tubular body are moved relative to one another so that the jet of etchant traverses the tubular body lengthwise and thereby causes the tube to be sliced longitudinally. The tubular body 10A is indexed about its longitudinal axis so that the jet 46 can slice the tubular body at selected circumferentially spaced regions. The jet etch cutting technique is not described in greater detail since the technique is well known in the art and is described, for example, by C. R. Booker and R. Stickler, British Journal Applied Physics, 1962, volume 13, page 446. If silicon oxides exist on the outer and/or inner surfaces of the tube, they may be removed by means of a suitable etchant as previously described before or after the tube is cut by the jet cutting technique described above.

One skilled in the art will appreciate that if the tubular bodies 10 are initially grown to a suitable diameter, they may be sliced longitudinally so as to form elongate bodies which have the general appearance of ribbons but that are characterized by a circular but gentle cross-sectional curvature instead of being flat. By way of example, a 2 inch diameter silicon tube may be cut into 6 one inch wide sections which have a rise of about ⅛". The curvature in cross-section may be sufficiently gentle for the resulting solar cells to be used as replacements for solar cells made from flat ribbons. Moreover it is contemplated that for certain applications a solar cell which has a gentle circular curvature to its radiation receiving surface may be more advantageous than a conventional flat solar cell.

The most significant advantage of the invention is that the resulting ribbon-like sections 26 are substantially free of so-called "edge defects". Eliminating such edge defects enhances the overall efficiency of the resulting solar cell. A further advantage results from the fact that tubular bodies may be grown by the EFG technique at a pulling rate substantially the same as the pulling rate for flat ribbons, with the result that the productivity of ribbon for manufacture of solar cells is increased if tubular bodies are grown in place of ribbons and then severed as herein described. The growth of tubular shaped bodies by the EFG process is easier than the growth of two dimensional ribbon shaped members.

It is to be noted that the foregoing description illustrates the production of solar cells commencing with the formation or provision of a substantially monocrystalline tube having a substantially circular cross-section. However, one skilled in the art of growing crystals by the EFG technique will appreciate that the advantages of the present invention can also be realized by starting with a tube of oval or polygonal geometry, and slicing such tubes to form flat or nearly flat ribbons.

Another possible modification comprises the following steps: (a) providing tubular bodies as above-described, (b) slicing the bodies longitudinally into ribbon-like sections, and (c) then processing the individual sections to form P-N junctions in accordance with known techniques, followed by formation of front and back electrodes as above-described..

Obviously the invention may be practiced by using N-type silicon tubes and introducing a P-type layer or zone to the tube so as to form the required P-N junction. Also the tubes and solar cells may be made of some other material beside silicon, e.g. cadmium telluride. Obviously no doping of the tubes or ribbons is required in the case of sapphire ribbons to be used as substrates for silicon integrated circuit devices.

Still other modifications and advantages will be obvious to one skilled in the art. Thus, for example, it is contemplated that the electrodes could be formed on the silicon tubes prior to cutting rather than forming them on the separated sections 26. Of course, any diffusion oxides present on the tube would have to be removed before the electrodes could be deposited on the tube. A further modification consists of substituting an etch-resistant wax for the photo-resist coating and removing selected portions of the wax by scribing them away with a suitable tool so that narrow like areas of the tube are exposed as at 24 in FIG. 3. After the tube has been cut into sections 26 by exposing the areas 24 to the etchant as previously described, the wax is removed from the sections by means of a suitable organic solvent, e.g. naphtha, toluene, etc. Still other modifications will be obvious to persons skilled in the art.

It is to be understood that the term "substantially monocrystalline" as used herein is intended to embrace a crystalline body that is comprised of a single crystal or two or more crystals, e.g. a bicrystal or tricrystal, growing together longitudinally but separated by a relatively small angle (i.e. less than about 4°) grain boundary.

What is claimed is:

1. A solar cell unit comprising an arcuate section of a curved substantially monocrystalline semi-conductor tubular body with a radiation-receiving convex surface and a photo-voltaic junction which is close to said convex surface and is capable of responding to radiant energy passing through said surface, and first and second electrodes carried by said arcuate section of said body on opposite sides of said junction for coupling said unit to an external circuit, said opposite sides each having an arcuate cross-section.

2. A solar cell according to claim 1 wherein said body is made of silicon.

3. A solar cell unit according to claim 1 wherein said arcuate section comprises a section of a hollow cylinder.

* * * * *